United States Patent [19]

Varettoni

[11] 4,085,432
[45] Apr. 18, 1978

[54] VOLTAGE LIMITER CIRCUIT

[75] Inventor: Leroy Wilfred Varettoni, Bridgewater, N.J.

[73] Assignee: RCA Corporation, New York, N.Y.

[21] Appl. No.: 795,141

[22] Filed: May 9, 1977

[30] Foreign Application Priority Data

May 21, 1976 United Kingdom ............... 21165/76

[51] Int. Cl.$^2$ ............................................. H02H 3/20
[52] U.S. Cl. ........................................ 361/91; 357/13
[58] Field of Search ...................... 361/91, 56; 357/13, 357/46; 307/275, 273, 283, 291, 302; 328/206, 207

[56] References Cited

U.S. PATENT DOCUMENTS

| 3,421,025 | 1/1969 | Mitchell et al. ...................... 307/302 |
| 3,427,512 | 2/1969 | Mapother ........................... 357/13 X |
| 3,833,824 | 9/1974 | Parks .................................... 307/291 |

*Primary Examiner*—Patrick R. Salce
*Attorney, Agent, or Firm*—H. Christoffersen; Samuel Cohen

[57] ABSTRACT

The negative voltage transient associated with an inductive load of a circuit, is limited to a desired value while protecting other parts of the circuit from damage or improper operation, by providing a breakdown path, in the reverse direction, through at least one semiconductor junction. This junction may be the collector-to-base junction of a transistor which is employed to supply current to the inductor during another period in the operating cycle of the circuit.

4 Claims, 3 Drawing Figures

VOLTAGE LIMITER CIRCUIT

The present invention relates to a circuit for limiting to a controlled value the voltage swing which occurs in a circuit such as one employing an inductance.

Figure 1:
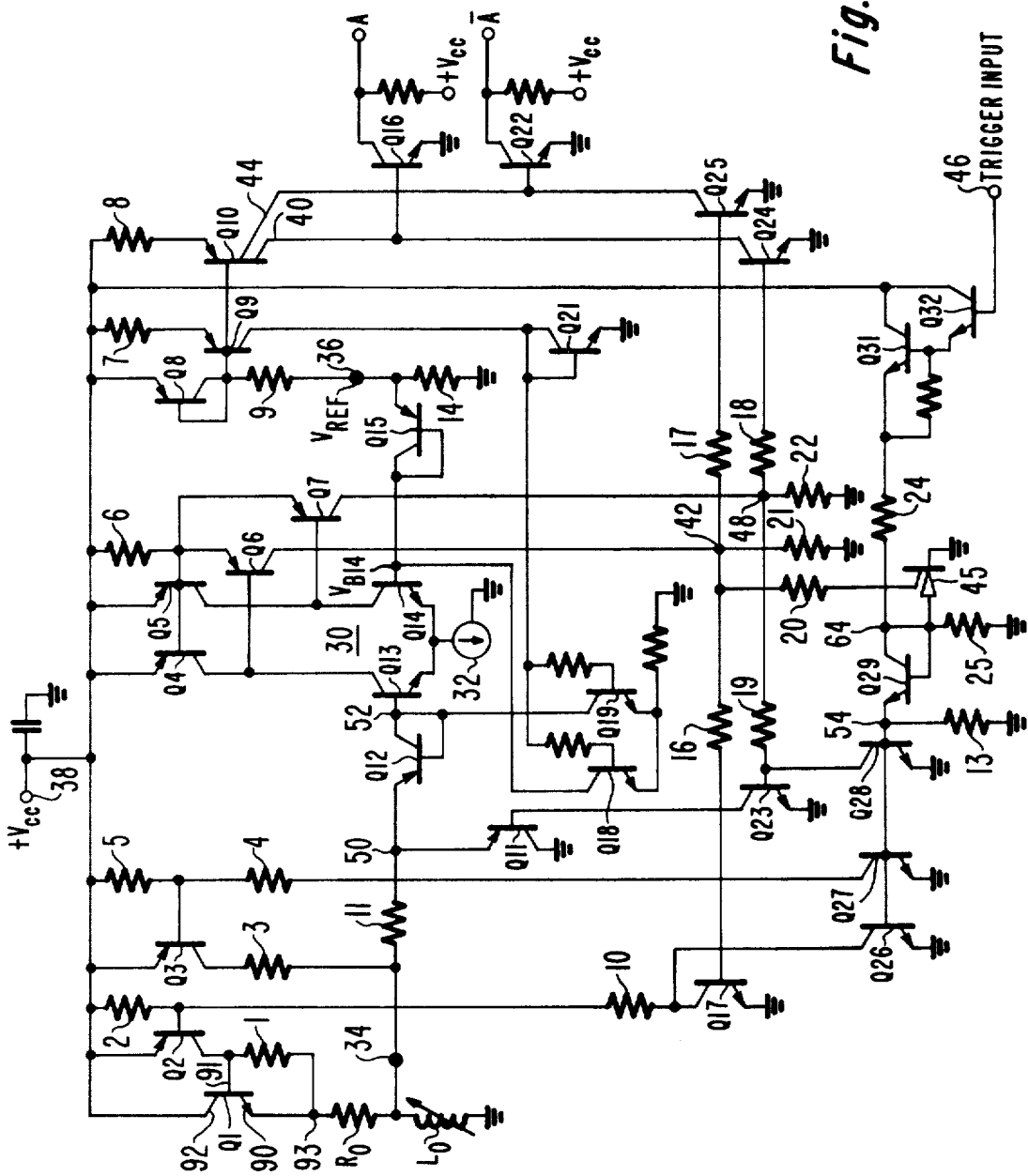
FIG. 1 is a schematic circuit diagram of a monostable circuit embodying the invention.

The monostable circuit of FIG. 1 includes an inductor $L_0$ and a resistor $R_0$. The inductor and resistor are discrete elements; almost all of the remaining circuit elements shown are preferably integrated onto a common semiconductor substrate. The LR time constant of the two elements $L_0$ and $R_0$ is primarily what controls the duration of the quasi-stable state of the circuit. Either $L_0$ or $R_0$, or both, may be variable, but in one particular design, $L_0$ was made variable for adjusting the duration of this quasi-stable state. The circuit also includes a comparator 30 comprising a differential amplifier. The latter includes two transistors Q13, Q14, the joined emitters of which connect to a current source 32. The base of transistor Q13 senses the voltage across the inductor $L_0$, that is, the voltage at terminal 34 and the base of transistor Q14 is coupled to a circuit point 36 which is held at a reference level $V_{REF}$.

Quiescently, the voltage $V_{B14}$ at the base of transistor Q14 exceeds that at the base of transistor Q13 so that transistor Q14 is on and transistor Q13 is off. In response to a trigger pulse applied to terminal 46, the base of transistor Q13 is driven to a voltage level greater than that at the base of transistor Q14, turning on transistor Q13 and turning off transistor Q14. This is the quasi-stable state of the circuit. After a certain time, dependent primarily on the values of $R_0$ and $L_0$, the voltage across the inductor decays until the base voltage of transistor Q13 becomes lower than that of transistor Q14, whereupon the circuit switches back to its stable state. The voltage at node 34 now reverses polarity and goes highly negative as shown at 72, waveforms a of FIG. 2.

A feature of the present circuit is the means for limiting this negative swing to a desired level (which is in the range of 30-50 volts in one particular design). In brief, this means includes transistor Q1 and resistor 1. The transistor serves two functions. It supplies current to the inductor through its collector-emitter path in the forward direction in response to the input trigger pulse, and its base-collector path conducts in the reverse direction at a controlled level when the voltage at node 34 abruptly swings negative. The low reverse breakdown voltage is designed into the transistor by surface implanting the collector region as explained in more detail later after the detailed discussion of the circuit operation which follows.

In the quiescent condition of the circuit, diode-connected transistor Q8 conducts and current flows from the input voltage supply terminal 38 through the path comprising transistor Q8 and resistors 9 and 14. With the supply voltage $V_{CC}$ at a level such as +10 volts, reference voltage developed at node 36 is approximately 2.8 volts. Current therefore flows through diode-connected transistor Q15 and the base-emitter junction of transistor Q14, turning on transistor Q14. At the same time, as will be discussed shortly, there is no current flowing through inductor $L_0$ so that node 34 is at ground potential. The base of transistor Q13 also is substantially at ground level (as discussed shortly) so that transistor Q13 is off and transistor Q14 conducts all of the current withdrawn by current source 32.

As transistor Q14 is on, current flows through its collector-emitter path via transistor Q5. Transistor Q4 is in condition to conduct; however, as transistor Q13 is off, no current flows through transistor Q4.

The base-collector voltage of transistor Q5 forward biases the emitter-base junction of transistor Q7, turning this transistor on so that current flows through the path comprising resistor 6, the emitter-collector path of transistor Q7 and resistor 22. The current flow through resistor 6 places the emitter of transistor Q6 at a less positive potential than its base so that transistor Q6 is off. The voltage developed across resistor 22 in response to the flow of current therethrough from transistor Q7, acts as a forward bias for transistor Q24, turning this transistor on. The collector current demand of transistor Q24 is met by transistor Q10, current flowing through resistor 8 and the emitter-to-collector 40 path of transistor Q10. As transistor Q24 utilizes the entire collector current available at 40, none remains for transistor Q16 and this transistor is therefore off. Accordingly, the output A of the monostable circuit is high at $+V_{CC}$.

It was previously mentioned that transistor Q6 is off. As no current flows through this transistor and resistor 21, node 42 of the circuit is at ground so that transistor Q25 is off. Accordingly, the current flowing from the collector 44 of transistor Q10 flows through the base-emitter junction of transistor Q22, turning this transistor on. The complementary output $\bar{A}$ of the circuit therefore is at ground level.

As node 42 of the circuit is at ground, the gate electrode of silicon controlled rectifier (SCR) 45 is also at ground. This tends to maintain the SCR off. It will be shown shortly that the anode of the SCR 45 also is at ground so that the SCR is off.

As node 42 is at ground, transistor Q17 is off and no current flows through resistor 2. Therefore, transistor Q2 is off as is transistor Q1. This confirms what was previously stated, namely that no current flows through resistor $R_0$ or inductor $L_0$ so that node 34 is at ground.

Transistors Q18 and Q19 operate as 10 microampere ($\mu$A) current sources in this particular circuit. Transistor Q18 conducts the current passing through transistor 15 when transistor Q14 is off; transistor Q19 acts as a bypass for current passing through transistor Q12 when transistor Q13 is off. Transistor Q12 which is connected as a diode, is designed to have a high reverse breakdown voltage, of the order of 80 volts in one particular design. Its purpose is to protect the emitter-base junction of transistor Q13, which may have a 7 volt reverse breakdown voltage, from the large negative voltage developed across $L_0$ during one period in the operating cycle of the circuit, as will be brought out later.

Transistors Q31 and Q32 comprise a Darlington pair. In the quiescent state of the circuit, the trigger input terminal 46 is at ground level so that the Darlington pair is off. No current flows through resistor 24 or transistor Q29 so that, as previously stated, the anode of the SCR 45 is held at ground level and the SCR is off. Also, the three transistors Q26, Q27 and Q28 are off.

It was previously mentioned that quiescently, transistor Q7 is on so that current flows through resistor 22 placing node 48 at a positive voltage level. Current flows from node 48 through resistor 19 and through the base-emitter junction of transistor Q23, turning transistor Q23 on. The effect is to clamp the base of transistor Q13 to close to ground level; actually to the collector-emitter saturation voltage level $V_{SAT}$ of transistor Q23. Note that transistor Q11 places node 50 at a level one base-emitter voltage drop ($1V_{BE}$) greater than this and transistor Q12 places node 52 at $1V_{BE}$ less than the voltage at node 50, confirming that node 52 is clamped to $V_{SAT}$ of transistor Q23, that is, at substantially ground level.

Assume now that a positive trigger pulse is applied to terminal 46. In practice, while the threshold of the circuit driven by the trigger pulse is about 2½ volts, the trigger pulse amplitude may be of the order of 10 volts, that is, the $V_{CC}$ level. The duration of this trigger pulse is not critical. It will be shown later that the circuit including the SCR differentiates the leading edge of this pulse, this leading edge switching the circuit to its quasi-stable state, and that, thereafter, the other elements of the circuit take over control and return the circuit to its stable state after a time primarily dependent on the LR time constant of $L_0$ and $R_0$.

When the trigger pulse goes positive, the Darlington pair Q31, Q32 goes on and current flows through the path from the $V_{CC}$ terminal 38 through the Darlington pair, resistor 24, transistor Q29 and resistor 13 to ground. The positive voltage thereby developed at node 54 at the bases of transistors Q26, Q27 and Q28 turns these three transistors on. A positive voltage also appears at the anode of the SCR 64; however, the gate of this SCR still is at ground (node 42 at ground) so that the SCR remains off.

When transistor Q28 goes on, it places the base of transistor Q23 substantially at ground, turning off transistor Q23. This removes the clamp on node 50 so that the base electrode of transistor Q13 is free to assume a different potential.

When transistor Q26 goes on, current flows through the path including resistors 2 and 10 and the collector-emitter path of transistor Q26. The voltage now present across resistor 2 is sufficient to turn on transistor Q2 and transistor Q1 also turns on because of the flow of current through its base emitter junction. This current tends to flow through resistor $R_0$ and inductor $L_0$; however, since the current through an inductor cannot change instantaneously, the voltage across the inductor, that is the voltage at node 34, very steeply rises to a high level as indicated at 60 in waveform $a$ of FIG. 2.

At the same time that the above is occurring, current flows through resistor 5 and resistor 4 into the collector of transistor Q27. The voltage developed across resistor 5 turns on transistor Q3 and its collector current flows through resistor 3 and attempts also to flow into the inductor $L_0$. This creates the small voltage spike 62 on waveform $a$ of FIG. 2. The amplitude of leading edge 60 of waveform $a$ is close to $V_{CC}$, where as already mentioned, $V_{CC}$ may be 10 volts or so.

When node 34 steeply rises in potential, the base electrode of transistor Q13 also quickly assumes a potential greater than the voltage present at the base of transistor Q14 (the voltage $V_{B14}$ at the base of transistor Q14 is $1V_{BE}$ lower than $V_{REF}$). As soon as the base electrode of transistor Q13 becomes more positive than that of transistor Q14, transistor Q13 starts conducting and transistor Q14 goes off. Transistor Q4 now conducts the current supplied to the collector of transistor Q13, transistor Q5 is in saturation but does not conduct collector current, and transistor Q7 goes off because its base electrode goes relatively positive with respect to its emitter electrode. When transistor Q7 goes off, node 48 goes to ground level and this turns off transistor Q24. The collector 40 current of transistor Q10 now flows through base emitter junction of transistor Q16 and this turns this transistor on. The output A therefore switches from the $+V_{CC}$ level to ground level.

When node 48 goes to ground, transistor Q23 no longer receives base emitter current and this holds transistor Q23 off. It will be recalled that the base of transistor Q23 already has been placed substantially at ground level by conducting transistor Q28.

When transistor Q4 conducts, its base-collector voltage turns on transistor Q6 so that node 42 assumes a positive voltage level. This turns on transistor Q25 so that substantially all of the current supplied by the collector electrode 44 of transistor Q10 flows into the collector of transistor Q25. This causes transistor Q22 to turn off and A switches from ground level to $+V_{CC}$.

The positive level at 42 also turns on transistor Q17. This transistor is in parallel with transistor Q26 so that when transistor Q26 later goes off, transistor Q17 will still maintain transistors Q1 and Q2 conducting.

The positive level at node 42 causes gate current to flow in the SCR 45. The anode of this SCR already is positive so that the SCR turns on. When the SCR turns on, it places node 64 at a level close to ground so that transistors 26, 27 and 28 turn off. In this respect, the SCR device 45 in cooperation with the remaining circuit elements, operates as a differentiator for the leading (positive-going) edge of the trigger pulse. In response to the leading edge of the input trigger pulse, node 64 goes positive and shortly thereafter, the voltage at node 64 decays to close to ground level (actually to $V_{BE}+V_{SAT}$ which is the anode-to-cathode drop across the conducting SCR). The voltage present at node 64—the anode of the SCR, is shown at $d$ in FIG. 2. Note that when the trigger pulse terminates, the SCR stops conducting and the anode voltage returns to ground level.

When transistor Q27 goes off, immediately after the leading edge of the trigger pulse, current stops flowing through resistors 5 and 4 and transistor Q3 goes off. This stops the flow of current through the emitter-to-collector path of transistor Q3 to the inductor $L_0$ and this terminates the short spike 62 at the apex of the positive voltage swing across the inductor. As previously mentioned, the turn off of transistor Q26 does not affect transistors Q1 and Q2 which remain on because transistor Q17 is still on.

When transistor Q28 goes off, transistor Q23 would be able to turn on if there were base drive voltage present at node 48. However, as already mentioned, node 48 is at ground level so that transistor Q23 remains off.

Figure 2:
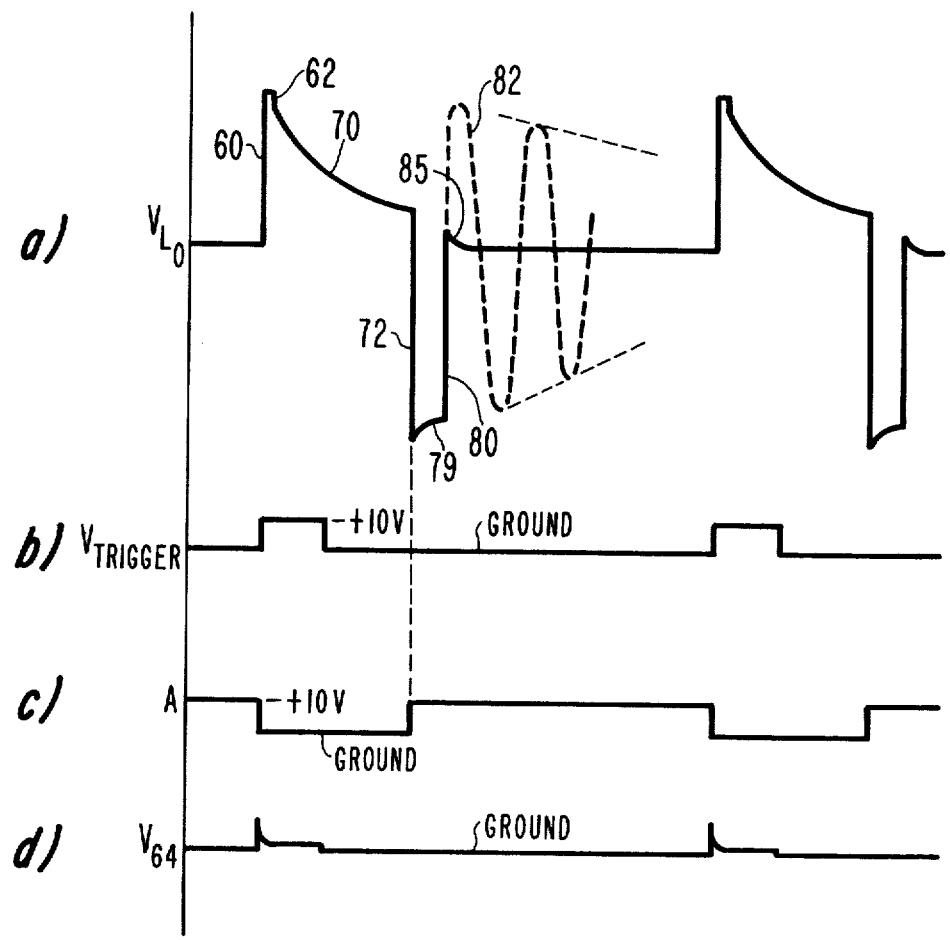
FIG. 2 is a drawing of waveforms to help explain the operation of the circuit of FIG. 1.

After the initial positive voltage peak develops across the inductor $L_0$, it starts to conduct current and the voltage across the inductor decays exponentially, as indicated as 70 in waveform $a$ of FIG. 2. The rate of decay is a function of the LR time constant of the inductor charging circuit. When the voltage decays sufficiently that the base electrode of transistor Q13 reaches a voltage level lower than that on the base electrode of transistor Q14, the comparator 30 switches states, that is, transistor Q13 stops conducting and transistor Q14 conducts all of the current withdrawn by source 32.

In response to the above, node 42 goes to ground level causing transistor Q17 to turn off and this causes transistors Q1 and Q2 to go off. This terminates the flow of current to the inductor $L_0$ and in response thereto, the voltage across the inductor changes polarity, node 34 going highly negative as indicated at 72 of waveform a in FIG. 2. The inductor voltage goes negative until a junction breakdown occurs (as discussed in connection with FIG. 3) and the current path is reestablished. The voltage at which this breakdown occurs determines the time required to discharge the inductor. The higher the voltage, the faster the discharge. It is important that this breakdown take place in an area that does not adversely affect circuit performance.

In a previous design of the present monostable circuit, the voltage above was defined, that is, limited, by a stack of zener diodes connected between node 50 and ground which limited the voltage at node 50 to a reasonable value such as 30–40 volts or so. This circuit operated in a satisfactory fashion; however, the zener diodes required space on the integrated circuit chip and the additional circuit elements also made the circuit more expensive and the construction somewhat more complex.

Figure 3:
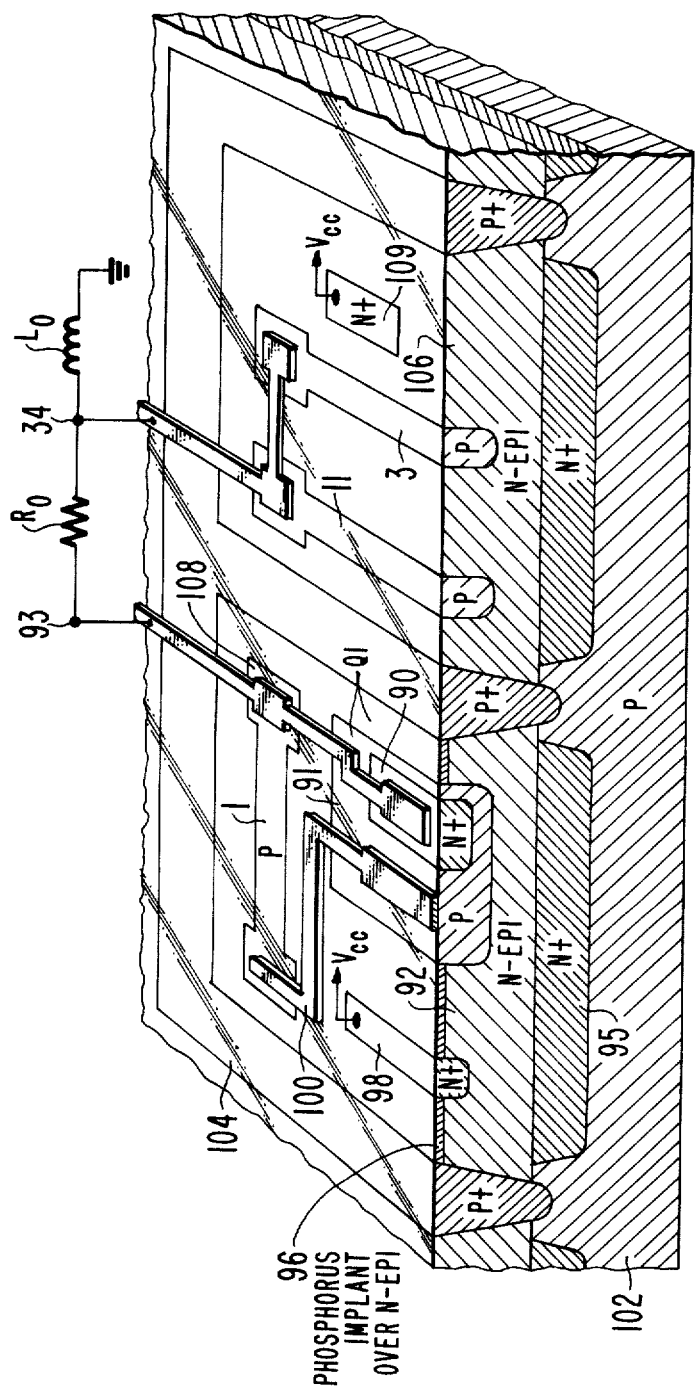
FIG. 3 is a more detailed showing, partially in section, of a number of the circuit elements of FIG. 1.

In the present circuit, no additional space is required for the voltage limiting circuit. Voltage limiting is handled by the transistor Q1 and resistor 1. The transistor is processed in a way to be discussed later so that the base 91 to collector 92 junction reverse breakdown voltage is of the order of 30–50 volts or so. Accordingly, when node 34 swings negative to a voltage somewhat higher than this, forward conduction occurs through the emitter 90 to base 91 junction of transistor Q1 and reverse conduction occurs through the base 91 to collector 92 junction of the transistor Q1. There is also a second conduction path in parallel with the one described. It is from the node 93 through resistor 1. This conduction path includes the semiconductor region which forms the collector region of transistor Q1. The various structures just mentioned are illustrated in FIG. 3 which will be discussed later.

The effect of the conduction through the two paths just discussed, is to place node 93 of the circuit, at a voltage level which may be of the order of −30 to −50 volts which can translate to a voltage such as −40 to −60 volts or so at node 34.

Whatever the level of negative voltage at node 34, transistor Q12 in series with the base-emitter junction of transistor Q13 provides added protection for this junction. The reason is the relatively high reverse breakdown voltage of transistor Q12 which causes any negative voltage present at node 50 to appear almost entirely between the emitter and common base collector connection of this transistor and insufficient voltage remains to break down the base-emitter junction of transistor Q13.

PNP transistor Q11, which is of opposite conductivity type than transistor Q23, acts as a blocking diode when nodes 34 and 50 go negative during the discharge of inductor $L_0$. If transistor Q11 were not present, the negative excursion would forward bias the collector-base junction of transistor Q23 (and also its collector substrate junction in an integrated circuit) and be clamped thereby to a small negative value. Transistor Q11 may be replaced by a diode (connected at its anode to node 50 and at its cathode to the collector of transistor Q23) of sufficiently high reverse breakdown voltage and similar operation obtained, assuming the loss of Q11's transistor gain is not critical (which it is not in the particular integrated circuit illustrated).

After the large negative swing, as shown at 72 in FIG. 2, current flow through the inductor $L_0$ decreases and the voltage thereacross becomes less negative, as indicated at 79 in waveform a of FIG. 2. When the current reduces to zero and it attempts to reverse, the voltage across the inductor swings positive as shown at 80 in FIG. 2. Were there no means present to prevent it, the voltage across the inductor would tend to swing highly positive—close to $V_{CC}$ (close to 10 volts in this example). The circuit comprising the inductor $L_0$ and the distributed capacitance coupled thereto, acts like a tuned circuit and were it not prevented, this circuit would ring at its resonant frequency as indicated by the sinusoid shown in phantom at 82 in FIG. 2. This, of course, would be disastrous to the circuit operation because the positive swing of the sinusoid, to a value such that the voltage on the base of electrode Q13 exceeded that at the base of transistor Q14 would cause the monostable circuit to re-trigger.

In the present circuit, the above does not occur. It does not because of the clamping action of transistors Q11 and Q23. At the time the voltage across the inductor attempts to swing positive, transistor Q13 is off so transistor Q6 is off and node 42 is at ground, and transistor Q14 is conducting so that transistor Q7 is on and node 48 is positive. Thus, transistor Q23 is on. This places the base of PNP transistor Q11 at close to ground level, conditioning Q11 to turn on when its emitter is driven positive. When node 50 attempts to go positive, transistor Q11 is driven into heavy conduction, clamping node 50 to ground. This is indirectly illustrated at 85 in waveform A of FIG. 2. Node 34 first goes slightly positive and then is clamped at ground level. This small positive level corresponds to a lower voltage level at the base of transistor Q13 than is present at the base of transistor Q14 so that transistor Q13 remains off and the circuit 30 remains in its stable state, that is, A remains high (at +$V_{CC}$) and A remains at ground.

FIG. 3 illustrates the actual structure of transistor Q1, resistor 1 and resistors 3 and 11. The emitter 90 of transistor Q1 comprises an N+ region which is located in a well comprising a P type diffusion 91. This P type region 91 is the base of transistor Q1. The collector 92 of the transistor comprises an N type epitaxial layer in which the base region 91 is located. This epitaxial region may have a thickness of the order of 10 microns. An N+ region 95 abutting the type epitaxial region 92 may be considered to be part of the collector region. It may be 3–4 microns thick and its function is to reduce the impedance of the collector region.

The reverse base 91-to-collector 92 breakdown voltage of transistor Q1, is reduced by the N type layer 96 which covers the upper surface of the collector region 92. This surface region comprises a phosphorous ion implant which may be produced by employing a dose of $2.2 \times 10^{12}$ at a voltage of 150 keV. The implant serves to increase the doping level at the surface of the epitaxial region and results in a reverse breakdown (P base or P resistor to the N epitaxial layer) which occurs at 30–50 volts or so. The breakdown level can be accurately defined and controlled using the implant process.

The N+ region 98 provides an area for making ohmic contact between the collector region 92 and the metallization to the $V_{CC}$ supply.

Element 1 comprises the resistor 1 of FIG. 1 which is formed as a P type diffusion in the N type epitaxial layer 92. Conductors 99 and 100 connect the opposite ends of the resistor to the emitter 90 and the base 91, respectively, of transistor Q1. The transistor and resistor structure are located on a P type substrate 102 and P type surrounds 104 are provided for purpose of isolation.

Resistors 11 and 3 are illustrated simply to show their construction. They are also located in an N-type epitaxial region shown at 106. This region is maintained at the $V_{CC}$ level by a connection to the N+ contacting region 109. The purpose of reverse biasing region 106, is to provide isolation between the resistors 3 and 11.

In the operation of the system, when the voltage across inductor $L_0$ abruptly goes negative, nodes 34 and 93 also go negative. Assuming the negative swing at 93 to be sufficient to cause reverse breakdown of transistor Q1, electrons flow in the forward direction from the emitter 90 N-type region to the base 91 P-type region. From there, these carriers (electrons) flow through the N-type collector regions, to the connection 98 to the $V_{CC}$ supply. There is also a second reverse breakdown path. It is from the end 108 of resistor 1 through the PN junction between this end and the N-type epitaxial region 92 to the N+ connection 98. According to the dosage employed, the reverse breakdown voltage required for conduction in these ways, may be of the order of 40–50 volts or so. In both cases, current flows through the external resistor $R_0$ which serves as added protection against any potentially damaging current levels.

Note in FIG. 3 that the phosphorous implanted surface region 96 is present over the surface of the N type epitaxial layer 92 which forms the collector of transistor Q1 and which surrounds the P-type resistor 1. Thus, these elements provide structures which exhibit a relatively low reverse breakdown voltage (30–50 volts compared to the normal collector-base breakdown of 80–100 volts). However, the N-type epitaxial region 106 is masked during the ion implant step so that the surface region 106 does not receive an ion implant. Accordingly, any high negative voltage at 34 will cause reverse breakdown (non-destructive) to occur at transistor Q1 and at resistor 1 but will not cause reverse breakdown through the elements within the N-type epitaxial region 106.

Referring back to FIG. 1, other devices are masked during the ion implantation step to insure that they retain relatively high reverse breakdown levels. For example, the regions in which the transistor Q3, Q11 and Q12 are formed, are masked from the ion implantation. This insures that the negative transient will not cause breakdown of devices which could adversely affect performance of the circuit.

What is claimed is:

1. In a circuit which includes a node, a plurality of current paths connected in parallel between said node and a point of reference potential, at least some of said paths each including at least one semiconductor junction poled in the same sense relative to said node, and in which there is produced at said node a voltage which may, at times, be in the reverse direction relative to said junctions and which, if not limited, may reach a level such as to adversely affect the circuit operation by causing reverse breakdown of one or more of said junctions, the improvement comprising:

one of said paths exhibiting a substantially lower resistance than all of the others to a voltage at said node in said reverse direction which attempts to exceed a given value, said path including one of said semiconductor junctions which will tolerate reverse breakdown without adversely affecting circuit operation, that junction having a substantially lower reverse breakdown voltage than the junctions in said other paths, whereby any tendency of said reverse voltage at said node to increase beyond said given value results in nondestructive current flow in the reverse direction through said junction to thereby limit the voltage at said node;

an inductor connected between said node and said point of reference potential; and said one junction comprising the base-to-collector electrode junction of a transistor which has also a base-to-emitter electrode junction, said transistor being connected to said node at said emitter electrode.

2. In a circuit as set forth in claim 1, further including:

means responsive to a trigger pulse for supplying current in the forward direction through the collector-to-emitter electrode path of said transistor to said inductor and for terminating the flow of said current after an interval of time, whereby after termination of said flow of current, the voltage across said inductor reverses and the voltage at said node, which is now in the reverse direction relative to said base-to-collector electrode junction, causes the flow of current in the reverse direction through said base-to-collector junction.

3. In a circuit which includes a node, a plurality of current paths connected in parallel between said node and a point of reference potential, at least some of said paths each including at least one semiconductor junction poled in the same sense relative to said node, and in which there is produced at said node a voltage which may, at times, be in the reverse direction relative to said junctions and which, if not limited, may reach a level such as to adversely affect the circuit operation by causing reverse breakdown of one or more of said junctions, the improvement comprising:

one of said paths exhibiting a substantially lower resistance than all of the others to a voltage at said node in said reverse direction which attempts to exceed a given value, said path including one of said semiconductor junctions which will tolerate reverse breakdown without adversely affecting circuit operation, that junction having a substantially lower reverse breakdown voltage than the junctions in said other paths, whereby any tendency of said reverse voltage at said node to increase beyond said given value results in nondestructive current flow in the reverse direction through said junction to thereby limit the voltage at said node, said one current path including a first semiconductor region of one conductivity type, a second semiconductor region of opposite conductivity type, at one portion of the surface of said one region and within said first region and forming with said first region said one of said semiconductor junctions, a connection from said second region to said node, and a connection from said first region to said point of reference potential, and in which there is present at another portion of the surface of the first region, in only said one current path, a semiconductor region of the same conductivity type as said first region with a substantially higher concentration of impurities than in the bulk of said first region to thereby make said another portion of the surface of said first region in said one path more highly doped than the bulk of said first region in said one path, said surface region serving to lower the reverse breakdown voltage of said junction between said first and second regions in said one of said paths.

4. In a circuit as set forth in claim 3, said only one of said paths including as the connection between said node and said second region, a third region at the surface of said second region and within said second region, said third region being of the same conductivity type as said first region and forming a junction with said second region, said first, second and third regions comprising the collector, base and emitter electrodes, respectively, of a transistor.

* * * * *